US009363454B2

(12) United States Patent
Ito et al.

(10) Patent No.: US 9,363,454 B2
(45) Date of Patent: Jun. 7, 2016

(54) SOLID-STATE IMAGING UNIT AND ELECTRONIC APPARATUS WITH A SIGNAL CHARGE ACCUMULATED IN A PHOTOELECTRIC CONVERSION SECTION IS DIVIDED TO BE READ IN PREDETERMINED TIMES OF INTERMEDIATE TRANSFER OPERATIONS AND A COMPLETE TRANSFER OPERATION

(71) Applicant: Sony Corporation, Tokyo (JP)

(72) Inventors: Yoshiaki Ito, Tokyo (JP); Gen Kasai, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/380,412

(22) PCT Filed: Feb. 5, 2013

(86) PCT No.: PCT/JP2013/052568
§ 371 (c)(1),
(2) Date: Aug. 22, 2014

(87) PCT Pub. No.: WO2013/140872
PCT Pub. Date: Sep. 26, 2013

(65) Prior Publication Data
US 2015/0021462 A1    Jan. 22, 2015

(30) Foreign Application Priority Data
Mar. 19, 2012   (JP) .................................. 2012-061703

(51) Int. Cl.
*H04N 5/378* (2011.01)
*H04N 5/372* (2011.01)
*H04N 5/355* (2011.01)
*H01L 27/148* (2006.01)
*H04N 5/357* (2011.01)
*H04N 5/365* (2011.01)
*H04N 5/3745* (2011.01)

(52) U.S. Cl.
CPC ...... *H04N 5/37213* (2013.01); *H01L 27/14831* (2013.01); *H04N 5/3575* (2013.01); *H04N 5/35554* (2013.01); *H04N 5/365* (2013.01); *H04N 5/378* (2013.01); *H04N 5/3745* (2013.01)

(58) Field of Classification Search
CPC .............. H04N 5/378; H04N 5/37213; H04N 5/37452; H04N 5/3559
USPC ........ 250/208.1, 214 R, 214.1; 348/294–311, 348/241–245; 257/290–292, 440–444
See application file for complete search history.

(56) References Cited

U.S. PATENT DOCUMENTS 7,324,144 B1 *  1/2008  Koizumi ................ H04N 5/355
                                                       348/294

FOREIGN PATENT DOCUMENTS

| JP | 61-105182    |  5/1986 |
| JP | 09-055473    |  2/1997 |
| JP | 2005-150801 A|  6/2005 |
| JP | 2008-263395 A| 10/2008 |
| JP | 2010-109677 A|  5/2010 |
| JP | 2010-226679 A| 10/2010 |
| JP | 2011-082852 A|  4/2011 |

* cited by examiner

*Primary Examiner* — Que T Le
(74) *Attorney, Agent, or Firm* — Chip Law Group

(57) ABSTRACT

A solid-state imaging unit includes: a pixel section including a plurality of pixels each including a photoelectric conversion section, a charge-voltage conversion section, and a transfer transistor transferring charge accumulated in the photoelectric conversion section to the charge-voltage conversion section; and a storage section storing information about an optimum value of an intermediate voltage to be applied to a gate of the transfer transistor at time of an intermediate transfer operation when a signal charge accumulated in the photoelectric conversion section is divided to be read in a predetermined times of the intermediate transfer operations and a complete transfer operation.

7 Claims, 9 Drawing Sheets

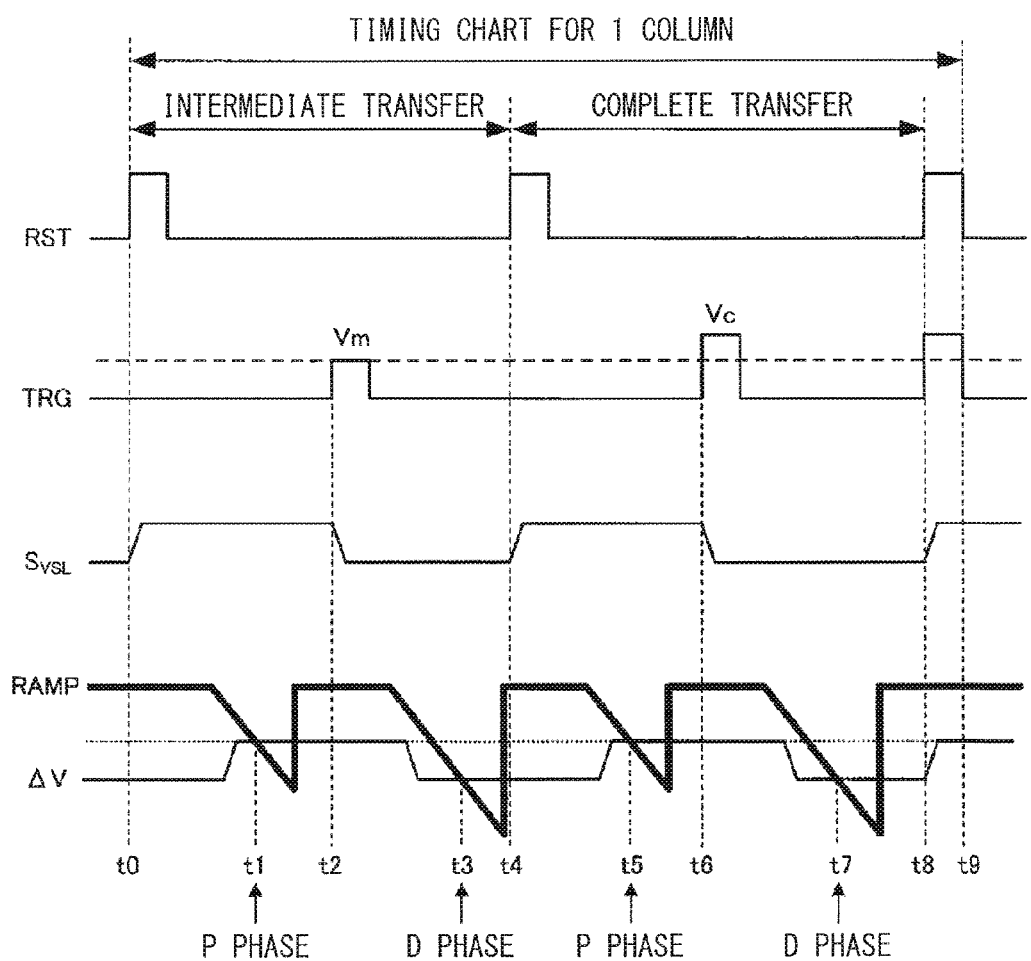

SOLID-STATE IMAGING UNIT AND ELECTRONIC APPARATUS WITH A SIGNAL CHARGE ACCUMULATED IN A PHOTOELECTRIC CONVERSION SECTION IS DIVIDED TO BE READ IN PREDETERMINED TIMES OF INTERMEDIATE TRANSFER OPERATIONS AND A COMPLETE TRANSFER OPERATION

TECHNICAL FIELD

The present disclosure relates to a solid-state imaging unit and to an electronic apparatus that includes the solid-state imaging unit.

BACKGROUND ART

As a solid-state imaging unit, a CMOS (Complementary Metal-Oxide-Semiconductor) image sensor that reads signal charge accumulated in a photodiode serving as a photoelectric conversion device via a MOS (Metal-Oxide-Semiconductor) transistor has been used for various applications.

In such a solid-state imaging unit, when a saturated charge amount of the photodiode is increased, the saturated charge amount may be larger than a maximum charge amount that is allowed to be accumulated in a floating diffusion section that converts the charge amount into a voltage signal in some cases. In this case, all of the charge amount accumulated in the photodiode is not allowed to be transferred to the floating diffusion section in one reading operation. Therefore, the reading operation is performed for a plurality of times (for example, see Patent Literature 1 and 2).

For example, in Patent Literature 1, first, the signal charge is divided to be transferred in a plurality of times of transfer operations by a transfer transistor from the photodiode to the floating diffusion section. It is to be noted that, at this time, an intermediate voltage is applied to a gate of the transfer transistor in the mid-course transfer operations (intermediate transfer operations). Further, in Patent Literature 1, a plurality of signals divided to be read in the plurality of times of operations are synthesized, and thereby, a voltage signal corresponding to the signal charge accumulated in the photodiode is generated.

Moreover, Patent Literature 2 discloses a method of controlling, by feedback control, the intermediate voltage at the time of dividing and reading, in the plurality of times of operations, the signal charge accumulated in the photodiode to have an optimum value. In the method disclosed in Patent Literature 2, part of pixels in a pixel section are forcibly saturated, and then, the intermediate voltage is controlled to have the optimum value based on a saturated charge amount of the forcibly-saturated pixels and charge amount remained in the photodiode after the intermediate transfer operation (mid-course reading operation).

CITATION LIST

Patent Literature

Patent Literature 1: Japanese Unexamined Patent Application Publication No. 2010-226679
Patent Literature 2: Japanese Unexamined Patent Application Publication No. 2010-109677

SUMMARY OF THE INVENTION

As described above, there has been proposed, for the solid-state imaging unit, various methods of dividing and reading, in a plurality of times of operations, the signal charge accumulated in the photodiode. By the way, the transfer transistor used at the time of transferring the signal charge accumulated in the photodiode to the floating diffusion section is generally configured of a MOSFET (MOS Field Effect Transistor).

The MOSFET has a simple structure, and therefore, is easy to be miniaturized. However, variations in its device characteristics (electric characteristics) are easily caused. In a process of manufacturing a semiconductor integrated circuit, variations are easily caused in its manufacturing conditions. Such variations in the manufacturing conditions give an influence on a shape of the MOSFET, physical conditions, etc. and such an influence causes variations in the electric characteristics of the MOSFET.

When variations in the electric characteristics (variations in performance) of the MOSFET as described are caused, performance at the time of reading a pixel signal from a pixel including the transfer transistor configured of the MOSFET also varies between pixels. In particular, the variations in performance of the transfer transistor largely influences reading performance at the time of the intermediate transfer operation in the solid-state imaging unit that has a configuration in which the signal charge accumulated in the photodiode is divided to be read in a plurality of times of operations.

Therefore, it is desirable to reduce the influence of the variations in performance of the transfer transistor described above in the solid-state imaging unit that has the configuration in which the signal charge accumulated in the photodiode is divided to be read in a plurality of times of operations and in an electronic apparatus that includes the solid-state imaging unit.

A solid-state imaging unit according to an embodiment of the present disclosure includes a pixel section and a storage section. Each of the sections is configured as follows. The pixel section includes a plurality of pixels each including a photoelectric conversion section, a charge-voltage conversion section, and a transfer transistor that transfers charge accumulated in the photoelectric conversion section to the charge-voltage conversion section. Further, the storage section stores information about an optimum value of an intermediate voltage to be applied to a gate of the transfer transistor at time of an intermediate transfer operation when a signal charge accumulated in the photoelectric conversion section is divided to be read in a predetermined times of the intermediate transfer operations and a complete transfer operation.

An electronic apparatus according to an embodiment of the present disclosure includes the above-described solid-state imaging unit of the present disclosure, and a signal processing circuit that performs a predetermined process on an output signal from the solid-state imaging unit.

It is to be noted that, in the present specification, "complete transfer operation" refers to a transfer operation (reading operation) to be performed last in a series of operations of dividing the signal charge accumulated in the photoelectric conversion section to be transferred (read) to the charge-voltage conversion section in a plurality of times of operations, by the transfer transistor. Further, in the present specification, "intermediate transfer operation" refers to a transfer operation performed before the complete transfer operation in the series of operations of dividing the signal charge accumulated in the photoelectric conversion section to be transferred (read) to the charge-voltage conversion section in the plurality of times of operations, by the transfer transistor. Moreover, in the present specification, "intermediate voltage" refers to a voltage that is larger than a low-level voltage applied to the gate of the transfer transistor and is smaller than a high-level voltage applied to the gate of the transfer transistor at the time of the complete transfer operation.

As described above, the solid-state imaging unit according to the embodiment of the present disclosure includes the storage section that stores information about the optimum value of the intermediate voltage to be applied to the gate of the transfer transistor at the time of the intermediate transfer operation. Therefore, according to the present disclosure, it is possible to perform the intermediate transfer operation with the use of the optimum value of the intermediate voltage stored in the storage section, and to reduce the influence of the variations in performance of the transfer transistor on the reading performance described above.

BRIEF DESCRIPTION OF THE DRAWINGS

FIG. 7 is a timing chart of various signals for explaining the operation of setting the optimum intermediate voltage of the solid-state imaging unit.

MODES FOR CARRYING OUT THE INVENTION

A solid-state imaging unit according to an embodiment of the present disclosure and an example of an electronic apparatus that includes the solid-state imaging unit will be described below in the following order in reference to the drawings. It is to be noted that the present disclosure is not limited to the examples below.
1. Configuration of Solid-state Imaging Unit
2. Method of Setting Optimum Value of Intermediate Voltage
3. Configuration of Electronic Apparatus (Application Example)

1. Configuration of Solid-state Imaging Unit

In the present embodiment, description will be given of a configuration example of a solid-state imaging unit of a scheme in which electric charge accumulated in a photodiode (hereinafter, described as "PD") is divided to be transferred, by a transfer transistor, to transfer the electric charge to a floating diffusion section (hereinafter, described as "FD section") in a plurality of times of operations. It is to be noted that, hereinafter, such a scheme is called a division reading scheme. In this division reading scheme, for example, a plurality of pixel signals (output data) divided to be read are added up at last to be outputted.

[Influence of Variations in Performance of Transfer Transistors]

First, before explaining a specific configuration of a solid-state imaging unit of the division reading scheme according to the present embodiment, brief description will be given of an event that may be caused by the variations in performance of the transfer transistors in the solid-state imaging unit of this scheme.

In the division reading scheme, it is desirable to allow a charge amount Qc remained in the PD immediately before the complete transfer operation to be equal to or less than a maximum charge amount (a saturated charge amount Qfd) that is allowed to be accumulated in the FD section. Specifically, it is desirable that a relationship represented by the following Expression (1) is established between the charge amount Qc to be read at the time of the complete transfer operation, a charge amount Qm to be read in each intermediate transfer operation, a saturated charge amount Qs of the PD, and the saturated charge amount Qfd of the FD section. It is to be noted that "n" in the following Expression (1) is the number of times of the intermediate transfer operations.

$$Qs-n \times Qm = Qc \leq Qfd \quad (1)$$

Figure 1A:
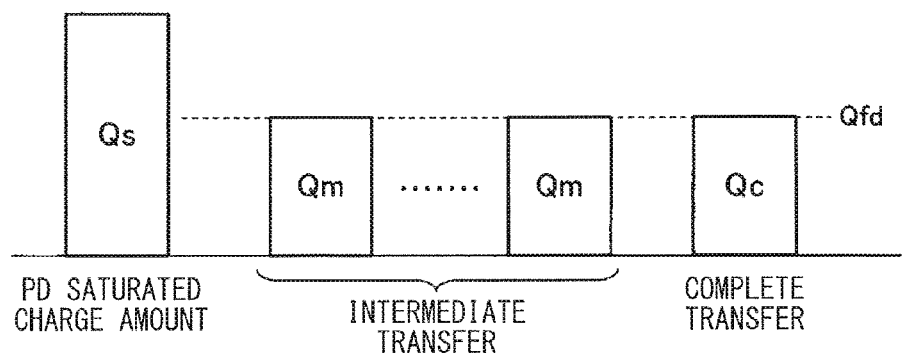
FIG. 1A is a diagram for explaining an influence of variations in performance of transfer transistors.
Figure 1B:
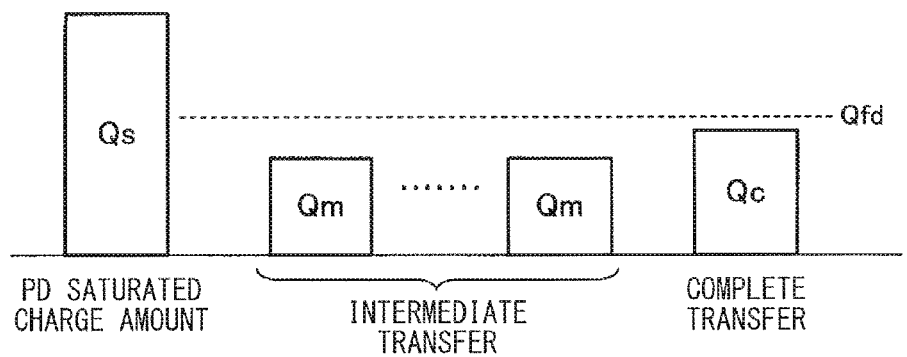
FIG. 1B is a diagram for explaining the influence of variations in performance of the transfer transistors.

FIGS. 1A and 1B each illustrate a relationship between the saturated charge amount Qs of the PD, the charge amount Qm to be read in each intermediate transfer operation, and the charge amount Qc to be read at the time of the complete transfer operation when the condition in the above-described Expression (1) is satisfied. It is to be noted that FIG. 1A shows an example of a case where Qc=Qfd is establisehd, and FIG. 1B shows an example of a case where Qc<Qfd is established. Moreover, FIG. 1C illustrates a relationship between the saturated charge amount Qs of the PD, the charge amount Qm to be read in each intermediate transfer operation, and the charge amount Qc to be read at the time of the complete transfer operation when the condition in the above-described Expression (1) is not satisfied.

As shown in FIGS. 1A and 1B, when the charge amount Qc to be read at the time of the complete transfer operation, i.e., a charge amount remained in the PD immediately before the complete transfer operation is equal to or less than the saturated charge amount Qfd of the FD section, charge is less likely to overflow from the FD section at the time of the complete transfer operation. Therefore, in such a case, data (a pixel signal) corresponding to the charge amount accumulated in the PD is allowed to be read accurately. It is to be noted that, hereinafter, the charge amount Qc (the charge amount remained in the PD immediately before the complete transfer operation) to be read at the time of the complete transfer operation is referred to as "intermediate voltage retained charge amount Qc".

Figure 1C:
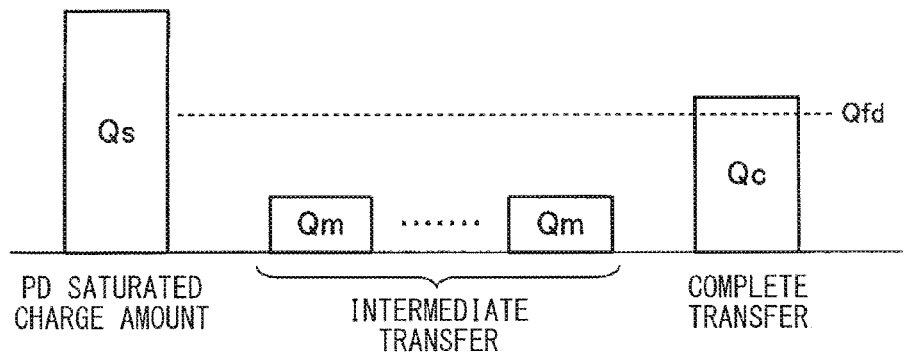
FIG. 1C is a diagram for explaining the influence of variations in performance of the transfer transistors.

On the other hand, as shown in FIG. 1C, when the transfer charge amount (Qm) in each intermediate transfer operation is relatively small (when the intermediate voltage is low), the intermediate voltage retained charge amount Qc may be larger than the saturated charge amount Qfd of the FD section in some cases. In such a case, out of the intermediate voltage retained charge amount Qc, a charge amount over the saturated charge amount Qfd of the FD section overflows from the FD section. Therefore, in such a case, it may be difficult to accurately read the data (the pixel signal) corresponding to the charge amount accumulated in the PD.

As described above, the intermediate voltage retained charge amount Qc varies depending on the transfer charge amount (Qm) in each intermediate transfer operation, and the transfer charge amount (Qm) in each intermediate transfer operation varies depending on the intermediate voltage applied to the gate of the transfer transistor at the time of the intermediate transfer operation. Therefore, in the division reading scheme, it is desirable to set the intermediate voltage to allow the condition in the above-described Expression (1) to be satisfied in each pixel in order to accurately read the data corresponding to the charge amount accumulated in the PD.

However, when variations are caused in performance of the transfer transistors between the pixels, even if the intermediate voltages to be applied to the transfer transistors in the respective pixels are the same, a height of a potential barrier (an electric potential) between the PD and the FD section varies between the pixels. In this case, the charge amount Qm transferred at the time of the intermediate transfer operation is different between the pixels, and at last, the intermediate voltage retained charge amount Qc also becomes different between the pixels. In other words, when the variations in performance of the transfer transistors are caused between the pixels, a pixel that does not satisfy the condition in the above-described Expression (1) may be present. In such a case, it may be difficult to accurately reproduce image data.

It is to be noted that, the influence of the variations in performance of the transfer transistors as described above is not taken into consideration in the above-described Patent Literature 1. Also, in the above-described Patent Literature 2, the intermediate voltage retained charge amount Qc is measured for part of the pixels and the intermediate voltage is controlled to have the optimum value. However, this control to achieve the optimum value is not performed for pixels used in a usual imaging operation. In other words, a pixel that does not satisfy the condition in the above-described Expression (1) may be caused also in the above-described Patent Literature 2.

Accordingly, description will be given below of an example of a solid-state imaging unit that has a configuration in which the condition in the above-described Expression (1) is satisfied in all of the pixels at the time of reading the signal charge.

[Configuration of Solid-State Imaging Unit]

Figure 2:
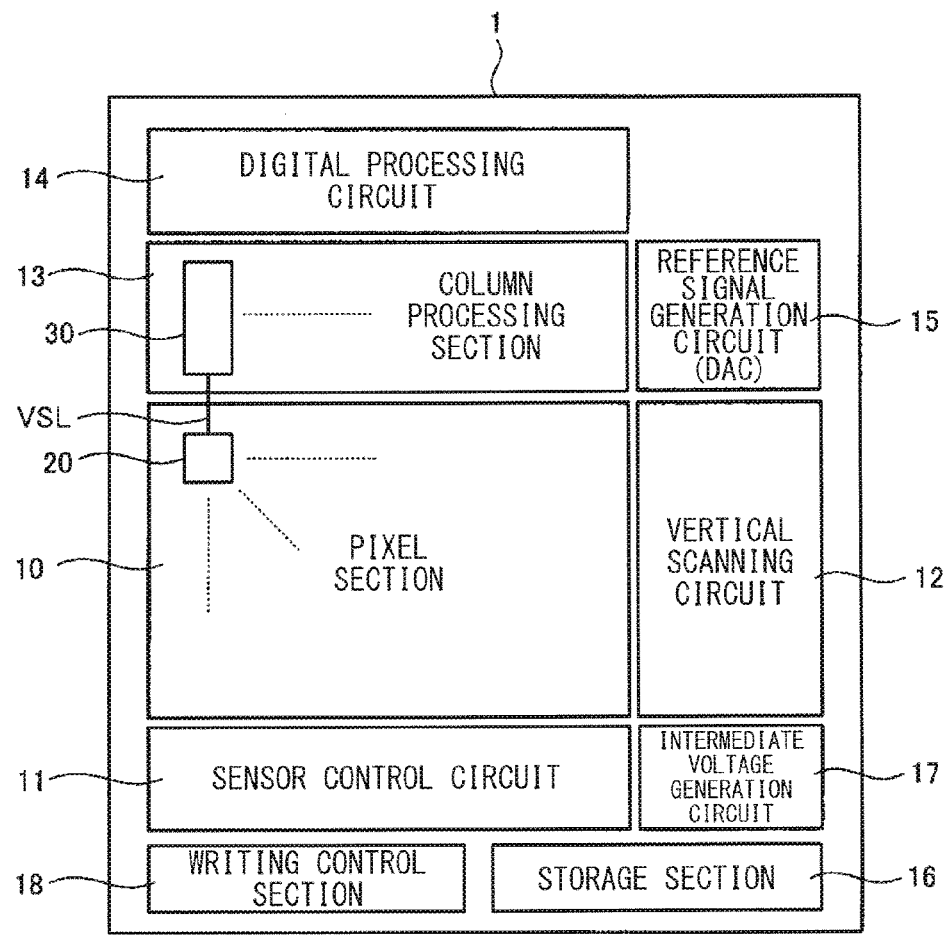
FIG. 2 is a schematic block configuration diagram of a solid-state imaging unit according to an embodiment of the present disclosure.

FIG. 2 illustrates a schematic configuration of a solid-state imaging unit of the division reading scheme according to an embodiment of the present disclosure. It is to be noted that FIG. 2 is a schematic block configuration diagram of the whole of the solid-state imaging unit.

A solid-state imaging unit 1 is a CMOS image sensor, and includes a pixel section 10, a sensor control circuit 11, a vertical scanning circuit 12, and a column processing section 13. Also, the solid-state imaging unit 1 includes a digital processing circuit 14, a reference signal generation circuit 15 (DAC: Digital to Analog Converter), a storage section 16, an intermediate voltage generation circuit 17, and a writing control section 18.

The pixel section 10 includes a plurality of unit pixels 20 (hereinafter, each simply referred to as "pixel 20") that are arranged two-dimensionally in a matrix. It is to be noted that an internal configuration of the pixel 20 will be described in detail later. Further, the pixel section 10 includes various pixel drive lines (not illustrated) and vertical signal lines VSL. The various pixel drive lines are formed in a row direction for each of rows of the pixels 20 that are arranged two-dimensionally in a matrix. The vertical signal lines VSL are formed in a column direction for each of columns of the pixels 20. It is to be noted that the various pixel drive lines are connected (not illustrated) to the vertical scanning circuit 12, and the vertical signal lines VSL are connected to the column processing section 13.

The sensor control circuit 11 may be configured, for example, of a timing generator or the like that generates timing signals of various operations of the solid-state imaging unit 1. Further, the various timing signals generated by the sensor control circuit 11 are supplied to the vertical scanning circuit 12, the column processing section 13, etc., and drive of the respective sections is controlled based on these timing signals.

The vertical scanning circuit 12 may be configured, for example, of circuit devices such as a shift resistor and an address decoder. The vertical scanning circuit 12 outputs various drive signals to each of the pixels 20 in the pixel section 10, drives each of the pixels 20, and reads a signal from each of the pixels 20.

The column processing section 13 includes a plurality of unit circuits 30 that perform a predetermined process on analog pixel signals (voltage signals) outputted to the vertical signal lines VSL. The unit circuit 30 is provided for each of the vertical signal lines VSL.

Each of the unit circuits 30 performs not only an AD (Analog to Digital) conversion process, but also performs a CDS (Correlated Double Sampling) process before and after the AD conversion process, on the pixel signal (voltage signal) obtained via the corresponding vertical signal line VSL. In other words, the unit circuit 30 performs a signal process of a dual noise cancelling scheme on the pixel signal obtained via the vertical signal line VSL. It is to be noted that an internal configuration and an operation of the unit circuit 30 will be described in detail later.

The digital processing circuit 14 performs various signal processes on a digital pixel signal (a count number) outputted from the column processing section 13. For example, the digital processing circuit may convert the inputted count number into an output code corresponding thereto.

The reference signal generation circuit 15 generates a reference signal (reference voltage) to be used at the time of performing AD conversion on the pixel signal, and supplies the reference signal to a later-described AD conversion circuit 34 (a comparator) in the column processing section 13. It is to be noted that, in the present embodiment, the reference signal generation circuit 15 also generates the reference signal and outputs the generated reference signal not only at the time of the usual operation but also at the time of the operation of setting the optimum value of the intermediate voltage before shipment.

The storage section 16 may be configured, for example, of a memory device such as an electrically-programmable fuse (eFuse: electric fuse). It is to be noted that, in the view point of easiness in manufacturing the solid-state imaging unit 1, it may be preferable to use, as the storage section 16, a memory device having a configuration that is allowed to be fabricated at the same time as a step of forming the MOS transistor configuring the pixel 20. In this point of view, it may be preferable to configure the storage section 16 of an electrically-programmable fuse (eFuse).

For example, the storage section 16 may store various information necessary at the time of reading the pixel signal of the optimum value of the intermediate voltage, etc. In the present embodiment, the storage section 16 stores information about the optimum value (a later-described optimum intermediate voltage Vmo) of the intermediate voltage that satisfies the condition in the above-described Expression (1) at the time of reading operation in all of the pixels 20 in the pixel section 10. Further, the storage section 16 is connected to the intermediate voltage generation circuit 17. At the time of reading the pixel signal, the information about the optimum value of the intermediate voltage stored in the storage section 16 is outputted to the intermediate voltage generation circuit 17.

It is to be noted that, in the present embodiment, as the various information necessary at the time of the reading operation, all of the optimum values (later-described optimum values Vmd) of the intermediate voltage for the respective pixels 20 may be stored in the storage section 16. Also, the number ("n" in the above-described Expression (1)) of times of the intermediate transfer operations may be stored in the storage section 16, together with the optimum values of the intermediate voltage. For example, the optimum value of the intermediate voltage corresponding to each of various numbers of times of the intermediate transfer operations may be stored in the storage section 16. By storing such information in the storage section 16, the optimum value of the intermediate voltage is allowed to be selected appropriately in accordance with the number of times of the intermediate transfer operations. However, when the number of times of the intermediate transfer operations is determined in advance in the solid-state imaging unit 1, the information of the number of times of the intermediate transfer operations may not be stored in the storage section 16. It is to be noted that the number n of times of the intermediate transfer operations may be set, for example, in consideration of design values of the saturated charge amount Qs of the PD 21 (see FIG. 3 described later) and the saturated charge amount Qfd of the FD section 26 (see FIG. 3), a frame rate specification of the solid-state imaging unit 1, etc.

Based on the information about the optimum value of the intermediate voltage inputted from the storage section 16, the intermediate voltage generation circuit 17 generates an intermediate voltage corresponding to the information and supplies the generated intermediate voltage to a gate of a later-described transfer transistor 22 at the time of the intermediate transfer operation. Further, at the time of the operation of setting the optimum value of the intermediate voltage performed before shipment of the solid-state imaging unit 1, the intermediate voltage generation circuit 17 generates intermediate voltages of various values to be used in such an operation.

The writing control section 18 is connected to the storage section 16. The writing control section 18 writes, in the storage section 16, the information about the optimum value of the intermediate voltage determined before shipment. Further, the writing control section 18 is electrically connectable to a later-described external testing apparatus 50 (see FIG. 5 described later), and is allowed to acquire the optimum value of the intermediate voltage measured by the external testing apparatus 50. It is to be noted that, in the present embodiment, description will be given of a configuration example of the solid-state imaging unit 1 that includes the writing control section 18. However, the present disclosure is not limited thereto. There may be adopted a configuration in which the optimum value of the intermediate voltage may be written directly in the storage section 16 by the later-described external testing apparatus 50. In this case, the writing control section 18 may not be provided.

Moreover, although not illustrated in FIG. 2, the solid-state imaging unit 1 also includes a horizontal scanning circuit that sequentially and selectively scans the unit circuits 30 provided for the respective vertical signal lines VSL in the column processing section 13. By this selective scanning performed by the horizontal scanning circuit, the pixel signals that have been subjected to the signal process in the respective unit circuits 30 in the column processing section 13 are sequentially outputted to the digital processing circuit 14.

[Configuration of Pixel]

Figure 3:
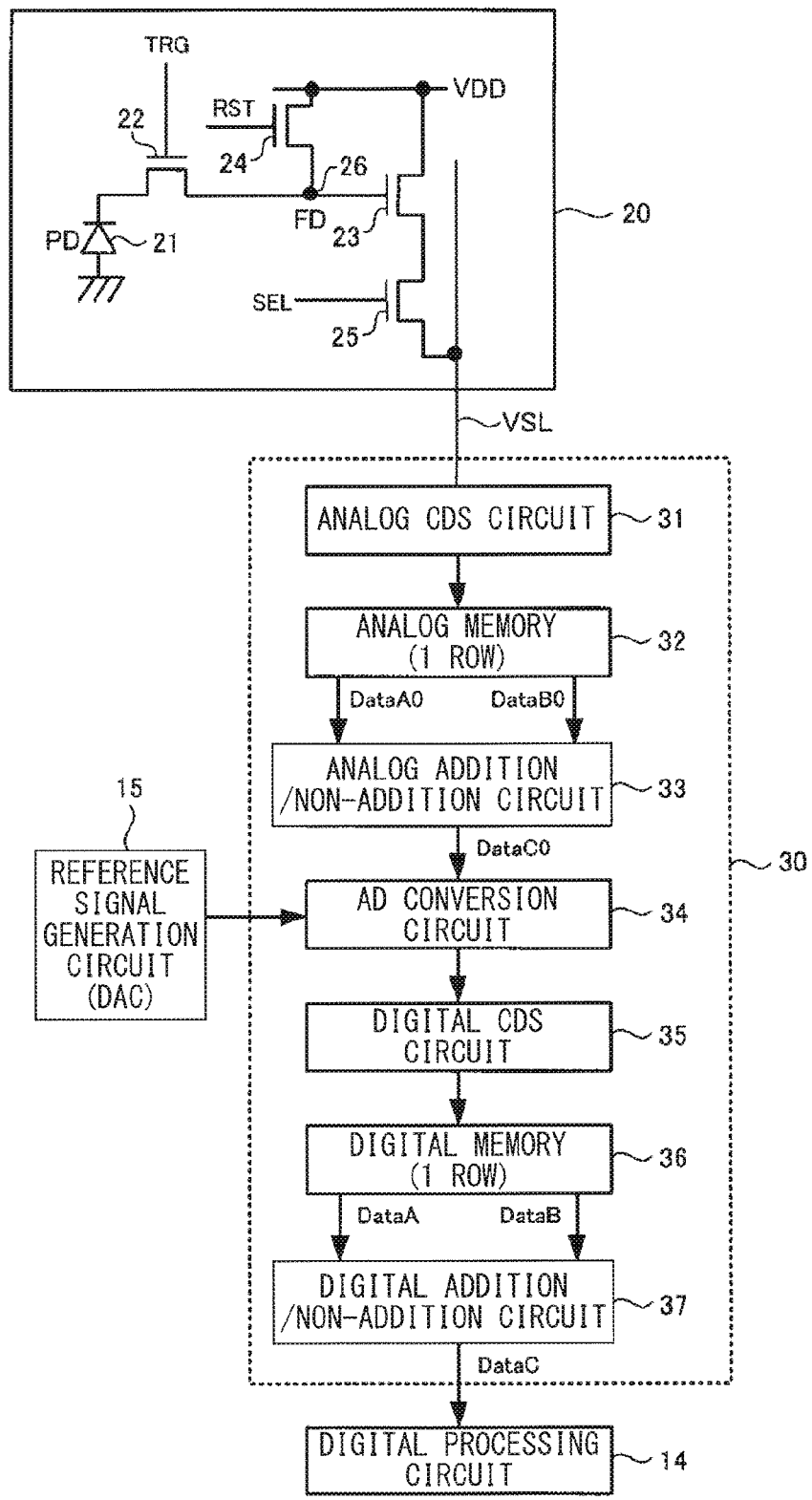
FIG. 3 is a schematic configuration diagram of each pixel and a unit circuit in a column processing section provided in correspondence with each pixel in the solid-state imaging unit according to the embodiment of the present disclosure.

Next, referring to FIG. 3, a configuration of each of the pixels 20 will be described briefly. It is to be noted that FIG. 3 is a schematic configuration diagram of the pixel 20 and the unit circuit 30 connected thereto. Further, FIG. 3 illustrates a configuration of the unit circuit 30 in a case where the number of times of the intermediate transfer operation is one.

The pixel 20 includes one PD 21 (photoelectric conversion section), and various active devices configured of the MOS transistors provided for the PD 21, and the FD section 26 (charge-voltage conversion section). In the example shown in FIG. 3, the pixel 20 includes, as the various active devices, a transfer transistor 22, an amplifier transistor 23, a reset transistor 24, and a selection transistor 25.

In other words, here, description will be given of an example where the pixel 20 is a pixel of a four-transistor type. It is to be noted that the present disclosure is not limited thereto, and the pixel 20 may be a pixel of a three-transistor type including no selection transistor 25. Moreover, here, an example in which various transistors are configured of MOS transistors having an N-type carrier polarity is shown. Moreover, in this example, for one pixel 20, three signal lines that are a transfer line, a reset line, and a selection line (not illustrated) are provided in the row direction, and the vertical signal line VSL is provided in the column direction.

The PD 21 converts incident light into charge (here, electron) of an amount corresponding to an amount of the incident light (performs photoelectric conversion). Further, an anode of the PD 21 is grounded. It is to be noted that, in the present embodiment, an example in which a photodiode is used as the photoelectric conversion device is explained. However, the present disclosure is not limited thereto, and for example, a photogate may be used as the photoelectric conversion device.

The transfer transistor 22 is provided between a cathode of the PD 21 and the FD section 26. The transfer transistor 22 is turned on when a high-level signal is inputted from the vertical scanning circuit 12 to a gate of the transfer transistor 22 via the transfer line, and transfers the charge (electron) that has been subjected to photoelectric conversion in the PD 21 to the FD section 26. It is to be noted that the charge transferred to the FD section 26 is converted into a voltage (potential) in the FD section 26.

A gate of the amplifier transistor 23 is connected to the FD section 26. Further, a drain of the amplifier transistor 23 is connected to a supply terminal of a power source voltage VDD. A source of the amplifier transistor 23 is connected to the vertical signal line VSL via the selection transistor 25. The amplifier transistor 23 amplifies a potential (voltage signal) of the FD section 26, and outputs the amplified signal to the selection transistor 25 as a light accumulation signal (pixel signal).

The reset transistor 24 is provided between the supply terminal of the power source voltage VDD and the FD section

26. The reset transistor 24 is turned on when a high-level signal is inputted from the vertical scanning circuit 12 to a gate of the reset transistor 24 via the reset line, and resets the potential of the FD section 26 to the power source voltage VDD.

The selection transistor 25 is provided between the amplifier transistor 23 and the vertical signal line VSL. The selection transistor 25 is turned on when a high-level signal is inputted from the vertical scanning circuit 12 to a gate of the selection transistor 25 via the selection line, and outputs the voltage signal that has been amplified in the amplifier transistor 23 to the vertical signal line VSL. In other words, in the solid-state imaging unit 1 of the four-transistor type, switching between selection and non-selection of the pixel 20 is controlled with the use of the selection transistor 25. It is to be noted that the voltage signal of each of the pixels 20 outputted to the vertical signal line VSL is transferred to a corresponding analog CDS circuit 31 described later.

[Configuration of Unit Circuit]

Next, referring to FIGS. 3 and 4, description will be given of an internal configuration and an operation of the unit circuit 30 in the column processing section 13 that is provided for each of the vertical signal lines VSL.

Figure 4:
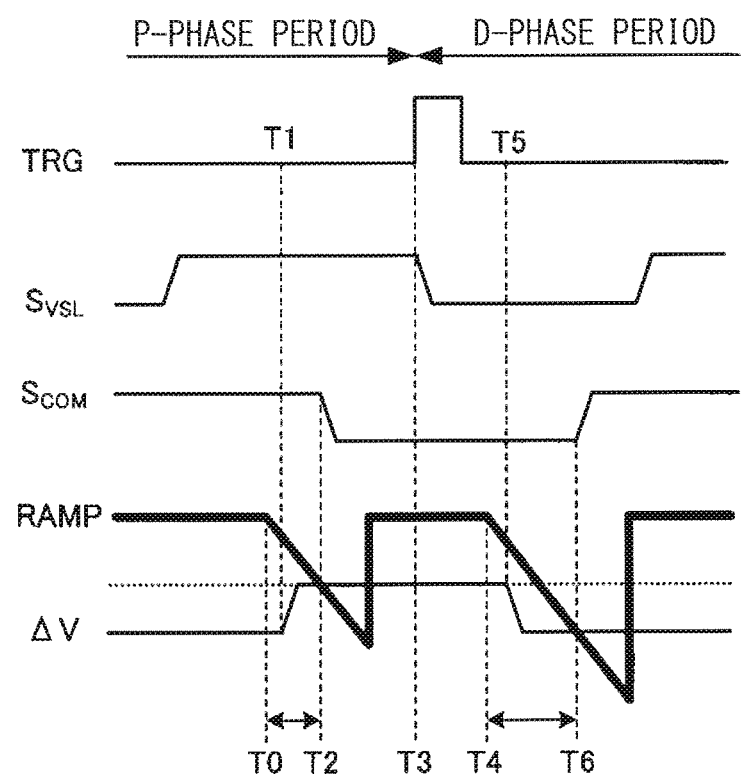
FIG. 4 is a timing chart of various signals for explaining an operation of the unit circuit in the column processing section.

It is to be noted that FIG. 4 is a timing chart of various signals for explaining operations of the respective sections in the unit circuit 30. Specifically, FIG. 4 shows a timing chart of a transfer signal (TRG) supplied to each of the pixels 20, a pixel signal (SVSL) outputted to the vertical signal line VSL, an output signal (SCOM) of the comparator, a reference signal (RAMP), and a signal ($\Delta V$) after the analog CDS process. For the sake of convenience in explanation, the reference signal (RAMP) and the signal ($\Delta V$) after the analog CDS process are illustrated to be overlapped with each other in FIG. 4.

As shown in FIG. 3, the unit circuit 30 includes the analog CDS circuit 31, an analog memory 32, an analog addition/non-addition circuit 33, an AD conversion circuit 34, a digital CDS circuit 35, a digital memory 36, and a digital addition/non-addition circuit 37. The analog CDS circuit 31, the analog memory 32, the analog addition/non-addition circuit 33, the AD conversion circuit 34, the digital CDS circuit 35, the digital memory 36, and the digital addition/non-addition circuit 37 are connected in series in order from the pixel section 10 side.

The analog CDS circuit 31 performs a correlated double sampling process (analog CDS process) on the pixel signal SVSL (voltage signal) obtained via the corresponding vertical signal line VSL. Specifically, the analog CDS circuit 31, first, detects a voltage level of a P phase at a predetermined timing T1 in a P-phase period (reset period) for the pixel signal SVSL outputted to the vertical signal line VSL (see FIG. 4). Subsequently, the analog CDS circuit 31 stores the voltage level detected at the timing T1 as a reference (for example, zero) in a memory (not illustrated) configured of a capacity or the like. Subsequently, the analog CDS circuit 31 detects a voltage level of a D phase at a predetermined timing T5 in a D-phase period (signal transfer period) (see FIG. 4), and detects a potential difference between that voltage level and the voltage level (reference level) of the P phase. Further, the analog CDS circuit 31 outputs, to the analog memory 32, a voltage-difference signal $\Delta V$ based on the voltage level of the P phase as the reference level as shown in FIG. 4.

By performing the above-described analog CDS process, for example, it is possible to remove a reset noise and a fixed-pattern noise unique to the pixel resulting from variations in threshold of the amplifier transistors, etc. It is to be noted that, in the present embodiment, the above-described analog CDS process is performed for each of the intermediate transfer operations and the complete transfer operation, and the potential-difference signals $\Delta V$ (output data: DataA0 and DataB0 shown in FIG. 3) obtained by the respective transfer operations are outputted separately to the analog memory 32.

The analog memory 32 temporarily stores the analog output data (potential-difference signal $\Delta V$) outputted from the analog CDS circuit 31. It is to be noted that, in the present embodiment, the pixel signal is read by the division reading scheme. Therefore, the analog memory 32 temporarily stores the output data (DataA0 and DataB0) outputted from the analog CDS circuit 31 at each of the times of performing the intermediate transfer operations and the complete transfer operation.

The analog addition/non-addition circuit 33 acquires the analog output data (DataA0) at the time of the intermediate transfer operation and the analog output data (DataB0) at the time of the complete transfer operation that are stored in the analog memory 32. Subsequently, the analog addition/non-addition circuit 33 performs an addition process or a non-addition process on the analog output data (DataA0) at the time of the intermediate transfer operation and the analog output data (DataB0) at the time of the complete transfer operation, in accordance with a level of the output data at the time of each of the transfer operations. Further, the analog addition/non-addition circuit 33 outputs, to the AD conversion circuit 34, data (DataC0) on which the addition process or the non-addition process are performed. It is to be noted that the addition and non-addition processes performed on the output data by the analog addition/non-addition circuit 33 are allowed to be performed in a manner similar to that of later-described processes performed in the digital addition/non-addition circuit 37. However, in the present embodiment, the analog addition/non-addition circuit 33 performs only the addition process.

The AD conversion circuit 34 includes a comparator which is not illustrated. The AD conversion circuit 34 compares, with the use of the comparator, the voltage level of the signal (potential-difference signal $\Delta V$) outputted from the corresponding analog addition/non-addition circuit 33 and the voltage level of the reference signal (RAMP) inputted from the reference signal generation circuit 15. Further, the AD conversion circuit 34 generates a signal (comparison result: SCOM) that has a signal level inverted at times T2 and T6 when the output levels of the two signals become the same as shown in FIG. 4.

It is to be noted that, in the present embodiment, the analog CDS process is performed in a stage before performing the AD conversion process. Therefore, the AD conversion circuit 34 performs the above-described comparison process on each of the signals (potential-difference signals $\Delta V$) of the P phase and the D phase that have been subjected to the analog CDS process and have been outputted from the analog addition/non-addition circuit 33. Moreover, the AD conversion circuit 34 outputs, to the digital CDS circuit 35, the comparison results (SCOM) of the P phase and the D phase that are obtained in the comparator in each of the intermediate transfer operations and the complete transfer operation.

The digital CDS circuit 35 includes a count section which is not illustrated. The count section measures (counts) a time period (comparison period) until the voltage level of the output signal (potential-difference signal $\Delta V$) from the analog addition/non-addition circuit 33 becomes the same level as the voltage level of the reference signal (RAMP) outputted from the reference signal generation circuit 15. At this time, the count section switches its count operation to one of an up-count operation and a down-count operation based on the comparison results (SCOM) obtained by the comparator in the AD conversion circuit 34.

Specifically, the count section performs the down-count operation in a period that is a P-phase comparison period (a period from a time T0 to the time T2 shown in FIG. 4) and in which the output signal SCOM of the comparator is at a high level. Further, the count section performs the up-count operation in a period that is a D-phase comparison period (a period from a time T4 to a time T6 shown in FIG. 4) and in which the output signal SCOM of the comparator is at a low level. Accordingly, a count number obtained after completing the up-count operation is a value obtained by subtracting an absolute value of a count number of the P-phase comparison period from an absolute value of a count number of the D-phase comparison period. In other words, the count number finally obtained by the D-phase count operation is output data on which the digital CDS process is performed. By this digital CDS process, it is possible to cancel the influence of the variations in characteristics of the analog CDS circuit 31, the AD conversion circuit 34, etc.

Further, the digital CDS circuit 35 outputs, to the digital memory 36, the count number of the D phase that has been finally obtained (the output data after the digital CDS process). It is to be noted that, in the present embodiment, the pixel signal is read by the division reading scheme. Therefore, the digital CDS circuit 35 outputs, to the digital memory 36, the count numbers (DataA and DataB shown in FIG. 3) of the D phase obtained at each of the times of performing the intermediate transfer operations and the complete transfer operation.

The digital memory 36 temporarily stores the count number (digital output data) outputted from the digital CDS circuit 35. It is to be noted that, at this time, the analog memory 32 temporarily stores the count number (DataA and DataB) outputted from the digital CDS circuit 35 at each of the times of performing the intermediate transfer operations and the complete transfer operation.

The digital addition/non-addition circuit 37 acquires the count numbers (DataA and DataB) that are stored in the digital memory 36 and have been obtained at each of the times of performing the intermediate transfer operations and the complete transfer operation. Further, the digital addition/non-addition circuit 37 performs the addition process or the non-addition process on the digital output data (DataA) at the time of the intermediate transfer operation and the digital output data (DataB) at the time of the complete transfer operation in accordance with the level of the output data at the time of each of the transfer operations. Further, the digital addition/non-addition circuit 37 outputs, to the digital processing circuit 14, the output data (DataC) on which the addition process or the non-addition process is performed.

Here, specific description will be given of a content of the addition process and the non-addition process performed by the digital addition/non-addition circuit 37. The digital addition/non-addition circuit 37 performs the addition process in cases of the following Situations A and B. It is to be noted that, here, description will be provided of a case where the number of times of the intermediate transfer operation is one.

[Situation A]

When the level of the output data (DataA) at the time of the intermediate transfer operation and the level of the output data (DataB) at the time of the complete transfer operation both take values between a predetermined upper-limit threshold ThH and a lower-limit threshold ThL, the digital addition/non-addition circuit 37 adds the both output data. Further, the digital addition/non-addition circuit 37 outputs the added data (DataC=DataA+DataB) to the digital processing circuit 14.

It is to be noted that the upper-limit threshold ThH and the lower-limit threshold ThL of the output data may be arbitrarily set, for example, based on an assumed noise amount, a value of the intermediate voltage Vm, etc. The upper-limit threshold ThH of the output data may be set, for example, to output data corresponding to a charge amount (3Qfd/4) that is ¾ of the saturated charge amount Qfd of the FD section 26, etc. Also, the lower-limit threshold ThL may be set, for example, to output data corresponding to a charge amount (Qfd/4) that is ¼ of the saturated charge amount Qfd of the FD section 26, etc.

[Situation B]

In a case where the charge accumulated in the PD 21 is divided to be transferred to the FD section 26 in two times of transfer operations, the intermediate voltage Vm is set so that the charge of about half of the saturated charge amount Qs of the PD 21 is transferred to the FD section 26 in the intermediate transfer operation in a state where the PD 21 is saturated. Therefore, for example, when the charge amount transferred at the time of the intermediate transfer operation is close to about half of the saturated charge amount Qs of the PD 21 (when the level of DataA is large to some extent), the charge amount remained in the PD 21 immediately before the complete transfer operation is also about half of the saturated charge amount Qs of the PD 21. In other words, when the level of the output data (DataA) at the time of the intermediate transfer operation is larger than the upper-limit threshold ThH, the charge amount transferred to the FD section 26 at the time of the complete transfer operation becomes about half of the saturated charge amount Qs of the PD 21, which is extremely large. In this case, the count number at the time of the complete transfer operation is a full-count value. Therefore, in this case, the digital addition/non-addition circuit 37 outputs, to the digital processing circuit 14, data (DataC=DataA+the full-count value) obtained by adding the full-count value to the output data (DataA) at the time of the intermediate transfer operation. Moreover, in this case, the output data (DataB) at the time of the complete transfer operation may not be read.

On the other hand, in cases of the following Situations C and D, the digital addition/non-addition circuit 37 performs the non-addition process.

[Situation C]

When the level of the output data (DataA) at the time of the intermediate transfer operation is lower than the lower-limit threshold ThL, the output data (DataA) at the time of the intermediate transfer operation may be considered to be a noise. Therefore, in this case, the output data (DataA) at the time of the intermediate transfer operation is not used. Specifically, in this case, the digital addition/non-addition circuit 37 does not add the output data (DataA) at the time of the intermediate transfer operation and the output data (DataB) at the time of the complete transfer operation, and outputs only the output data (DataB) at the time of the complete transfer operation as the output data (DataC).

[Situation D]

When the level of the output data (DataB) at the time of the complete transfer operation is lower than the lower threshold ThL, the output data (DataA) at the time of the intermediate transfer operation may be considered to be false data. Therefore, in this case, the output data (DataA) at the time of the intermediate transfer operation is not used. Specifically, in this case, the digital addition/non-addition circuit 37 does not add the output data (DataA) at the time of the intermediate transfer operation and the output data (DataB) at the time of the complete transfer operation, and outputs only the output data (DataB) at the time of the complete transfer operation as the output data (DataC).

2. Method of Setting Optimum Value of Intermediate Voltage

Next, description will be given of a method of setting an optimum value (hereinafter, referred to as "optimum intermediate voltage Vmo") of the intermediate voltage in the present embodiment. It is to be noted that, in the present embodiment, measurement and setting of the optimum intermediate voltage Vmo is performed before shipment of the solid-state imaging unit 1.

[Configuration of Intermediate Voltage Setting System]

Figure 5:
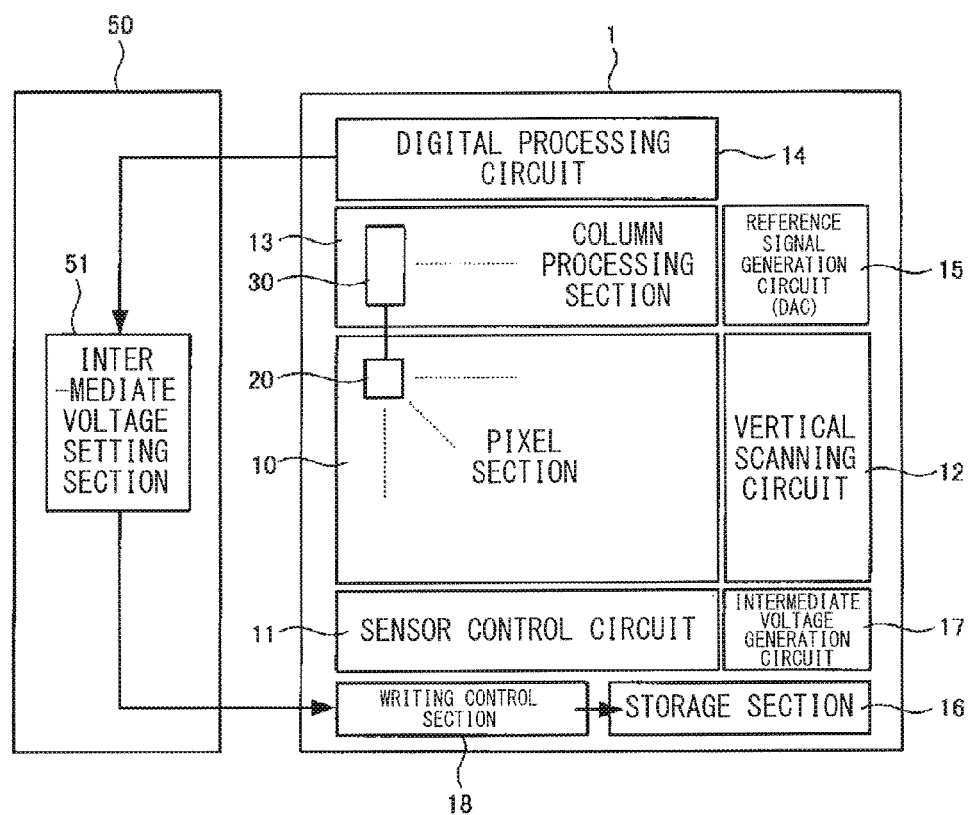
FIG. 5 is a schematic configuration diagram of a measurement system for determining an optimum intermediate voltage of the solid-state imaging unit.

FIG. 5 illustrates a schematic block configuration of an intermediate voltage setting system for performing measurement and setting of the optimum intermediate voltage Vmo of the solid-state imaging unit 1. As shown in FIG. 5, the intermediate voltage setting system is configured of the solid-state imaging unit 1 to be tested, and the testing apparatus 50 that is provided outside the solid-state imaging unit 1.

The testing apparatus 50 includes an intermediate voltage setting section 51. It is to be noted that, although not illustrated in FIG. 5, the testing apparatus 50 includes a control section for controlling an operation of setting the optimum intermediate voltage Vmo. Further, in the present embodiment, the testing apparatus 50 may include a uniform light source for testing that irradiates light to a light receiving section in the pixel section 10 at the time of the setting operation of the optimum intermediate voltage Vmo. Alternatively, the light source for testing may be provided separately from the testing apparatus 50.

The intermediate voltage setting section 51 is connected to the digital processing circuit 14 in the solid-state imaging unit 1. The intermediate voltage setting section 51 acquires output data obtained when various intermediate voltages Vm are applied to the respective pixels 20, at the time of the operation of setting the optimum intermediate voltage Vmo which will be described later. Further, the intermediate voltage setting section 51 determines an optimum value Vmd of the intermediate voltage Vm of each of the pixels 20 based on the various acquired output data. It is to be noted that, as described above, variations in performance are caused between the transfer transistors in the respective pixels 20. Therefore, variations are caused also between the optimum value Vmd of the intermediate voltages Vm of the respective pixels 20.

Moreover, the intermediate voltage setting section 51 determines the optimum intermediate voltage Vmo that satisfies the above-described Expression (1) at the time of reading operation in all of the pixels 20, out of the optimum values Vmd of the intermediate voltage Vm determined for the respective pixels 20. In the present embodiment, out of the optimum intermediate voltages Vmd determined for the respective pixels 20, the maximum value thereof is selected, and the selected maximum value is set to be the optimum intermediate voltage Vmo.

Moreover, the intermediate voltage setting section 51 is connected to the writing control section 18 in the solid-state imaging unit 1. The intermediate voltage setting section 51 outputs the determined optimum intermediate voltage Vmo to the writing control section 18. It is to be noted that the writing control section 18 writes, in the storage section 16, the optimum intermediate voltage Vmo inputted from the intermediate voltage setting section 51.

[Operation of Setting Optimum Intermediate Voltage]

Figure 6:
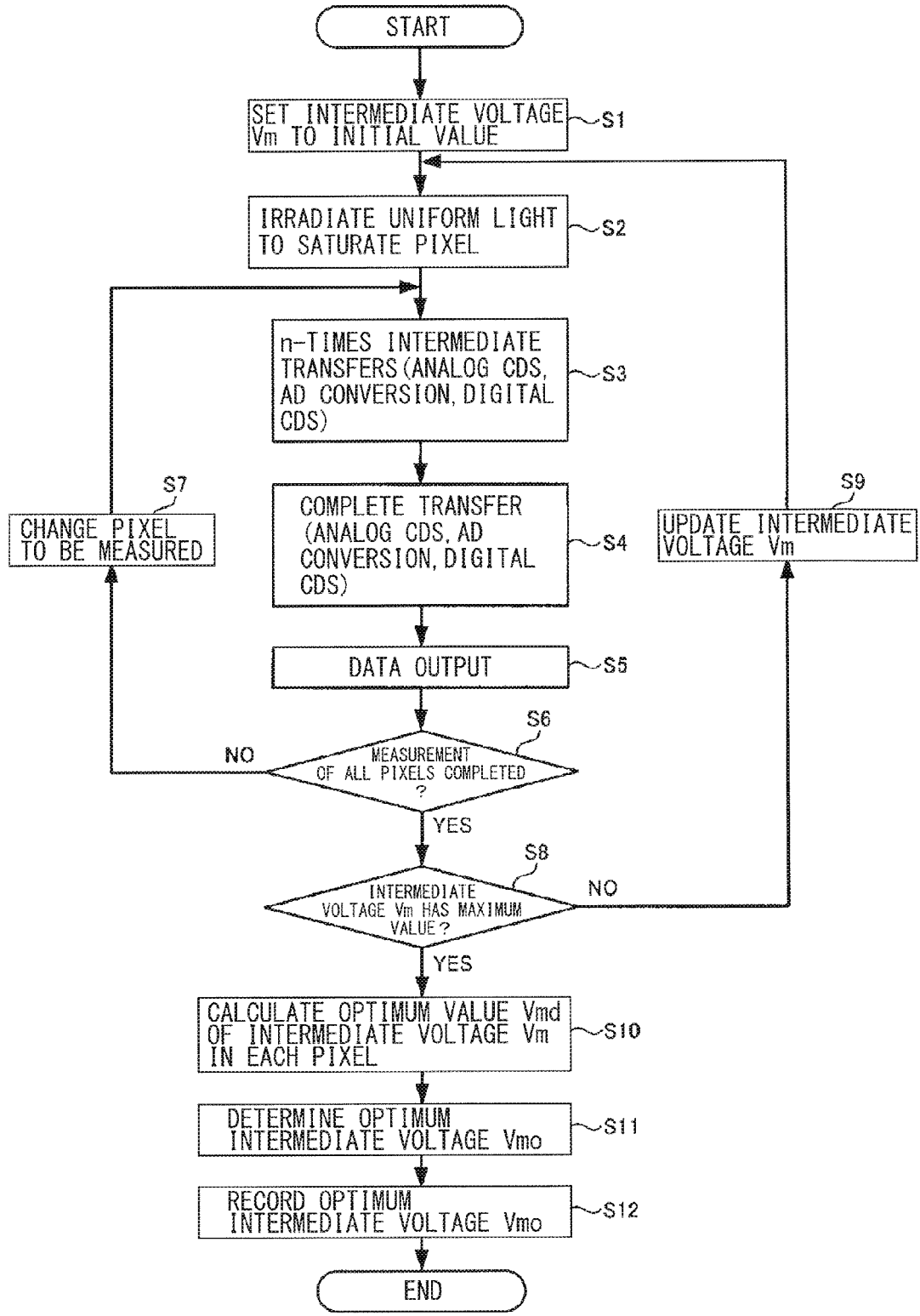
FIG. 6 is a flowchart showing procedures of an operation of setting the optimum intermediate voltage of the solid-state imaging unit.

Next, referring to FIGS. 6, 7, and 8A to 8D, more specific description will be given of the operation of setting the optimum intermediate voltage Vmo of the solid-state imaging unit 1 in the present embodiment. It is to be noted that FIG. 6 is a flowchart that illustrates procedures of the operation of setting the optimum intermediate voltage Vmo in the present embodiment. FIG. 7 is a timing chart for a reset signal (RST), a transfer signal (TRG), a pixel signal (SVSL) to be outputted to the vertical signal line VSL, a reference signal (RAMP), and a signal ($\Delta V$) after the analog CDS process, at the time of setting the optimum intermediate voltage Vmo. It is to be noted that, in FIG. 7, the reference signal (RAMP) and the signal ($\Delta V$) after the analog CDS process are illustrated to be overlapped with each other in order to make clear a state of the comparison process in the AD conversion circuit 34. Moreover, FIGS. 8A to 8D are diagrams that each illustrate a state of transferring the charge from the PD 21 to the FD section 26 at the time of the operation of setting the optimum intermediate voltage Vmo.

It is to be noted that the operation of setting the optimum intermediate voltage Vmo described below is controlled by an unillustrated control section in the testing apparatus 50.

First, an operator or the like connects the solid-state imaging unit 1 to be tested to the testing apparatus 50. Specifically, the operator or the like connects an input terminal of the intermediate voltage setting section 51 in the testing apparatus 50 to the digital processing circuit 14 in the solid-state imaging unit 1, and connects an output terminal of the intermediate voltage setting section 51 to the writing control section 18 in the solid-state imaging unit 1 (see FIG. 5).

Subsequently, the testing apparatus 50 sets the intermediate voltage Vm to be applied to each of the pixels 20 in the pixel section 10 to a predetermined initial value Vm_0 (step S1). It is to be noted that, in the present embodiment, the initial value Vm_0 of the intermediate voltage Vm is set to a minimum value in a variable range (Vm_0 to Vm_max) of the intermediate voltage Vm.

Subsequently, the testing apparatus 50 irradiates uniform light to the light receiving section of the pixel section 10, and forcibly saturates each of the pixels 20 (step S2). By step S2, the PD 21 becomes in a state in which the charge of the saturated charge amount Qs thereof is accumulated.

Subsequently, the testing apparatus 50 controls the solid-state imaging unit 1, and performs n times of the following intermediate transfer operations as follows on a predetermined pixel 20 (step S3). It is to be noted that, as described for the operation of the unit circuit 30 above, in each of the intermediate transfer operations, the analog CDS process, the AD conversion process (comparison process), and the digital CDS process are performed. Also, here, description will be given of an example in which the intermediate transfer operation is performed once (n=1) for the sake of simplification of the description.

Figure 8A:
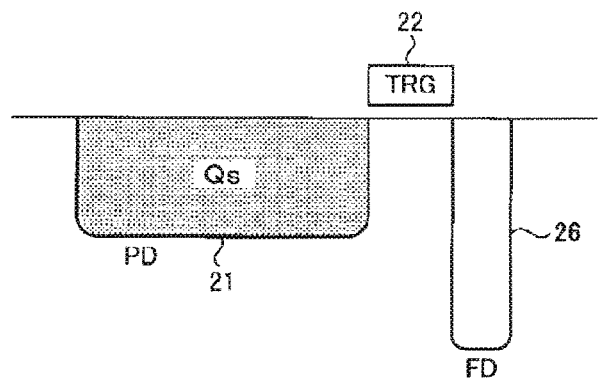
FIG. 8A is a diagram illustrating a state of an operation of transferring charge at the time of operation of setting the optimum intermediate voltage.

Specifically, first, the testing apparatus 50 controls the sensor control circuit 11 and the vertical scanning circuit 12 of the solid-state imaging unit 1, and supplies a high-level reset signal to the gate of the reset transistor 24 in the pixel 20 to be measured, at a predetermined time t0 (see FIG. 7). FIG. 8A illustrates a relationship between potentials (electric potentials) of a region of the PD 21, a gate region of the transfer transistor 22, and a region of the FD section 26 immediately after this reset operation. By this reset operation, the potential of the FD section 26 is reset to the power source voltage VDD, and the charge stored in the FD section 26 is discharged.

Subsequently, the column processing section 13 in the solid-state imaging unit 1 performs a comparison process between the reference signal RAMP and the signal (potential-difference signal ΔV) after the analog CDS process until the voltage level of the reference signal RAMP and the voltage level of the signal (potential-difference signal ΔV) after the analog CDS process become the same level. In an example shown in FIG. 7, the voltage level of the reference signal RAMP and the voltage level of the signal (potential-difference signal ΔV) after the analog CDS process become the same level at a time t1. At this timing, the output data of the P phase (reset state) corresponding to the state shown in FIG. 8A is obtained. However, in the operation of setting the optimum intermediate voltage Vmo, the output data of the P phase at the time of the intermediate transfer operation is not read.

Figure 8B:
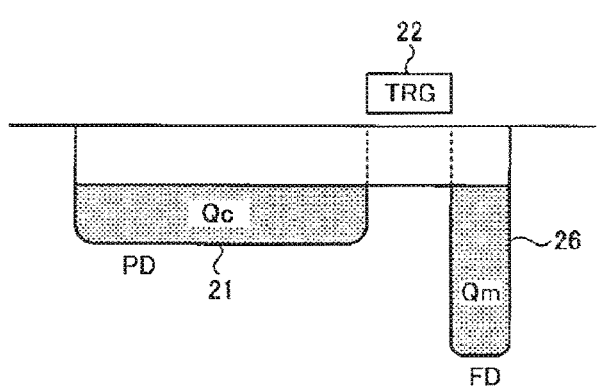
FIG. 8B is a diagram illustrating a state of the operation of transferring charge following FIG. 8A.

Subsequently, at a time t2, the testing apparatus 50 controls the sensor control circuit 11, the vertical scanning circuit 12, and the intermediate voltage generation circuit 17 in the solid-state imaging unit 1, and applies, to the pixel 20 to be measured, the initial value Vm_0 of the intermediate voltage Vm or the intermediate voltage Vm updated in later-described step S9. FIG. 8B illustrates a relationship between potentials (electric potentials) of the region of the PD 21, the gate region of the transfer transistor 22, and the region of the FD section 26 immediately after this operation of applying the intermediate voltage Vm. By the operation of applying the intermediate voltage Vm, a potential barrier of the gate region of the transfer transistor 22 is decreased. Accordingly, as shown in FIG. 8B, charge of an amount (the charge amount Qm) corresponding to the decrease of the potential barrier, out of the charge amount (the saturated charge amount Qs) accumulated in the PD 21 is transferred to the FD section 26.

Subsequently, the column processing section 13 in the solid-state imaging unit 1 performs the comparison process between the reference signal RAMP and the signal (potential-difference signal ΔV) after the analog CDS process until the voltage level of the reference signal RAMP and the voltage level of the signal (potential-difference signal ΔV) after the analog CDS process become the same. In the example shown in FIG. 7, the voltage level of the reference signal RAMP and the voltage level of the signal (potential-difference signal ΔV) after the analog CDS process become the same at the time t3. At this timing, output data of the D phase (signal transfer state) corresponding to a state shown in FIG. 8B is obtained. However, the output data of the D phase at the time of the intermediate transfer operation is not read in the operation of setting the optimum intermediate voltage Vmo.

In the present embodiment, the intermediate transfer operation in step S3 is performed in such a manner. It is to be noted that, when the intermediate transfer operation is performed twice or more, the above-described intermediate transfer operation is repeatedly performed twice or more.

Subsequently, the testing apparatus 50 controls the solid-state imaging unit 1, and performs the complete transfer operation as follows on the predetermined pixel 20 (step S4). It is to be noted that, in the complete transfer operation, in a manner similar to that at the time of usual operation after shipment, the analog CDS process, the AD conversion process (comparison process), and the digital CDS process are performed and the output data is acquired.

Figure 8C:
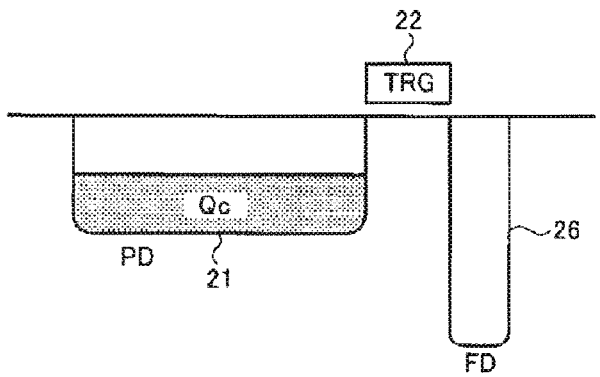
FIG. 8C is a diagram illustrating a state of the operation of transferring charge following FIG. 8B.

Specifically, as shown in FIG. 7, first, the testing apparatus 50 controls the sensor control circuit 11 and the vertical scanning circuit 12 in the solid-state imaging unit 1, and supplies a high-level reset signal to the gate of the reset transistor 24 in the pixel 20 to be measured at a time t4 (>t3). FIG. 8C illustrates a relationship of potentials (electric potentials) of the region of the PD 21, the gate region of the transfer transistor 22, and the region of the FD section 26 immediately after this reset operation. By this reset operation, the potential of the FD section 26 is reset to the power source voltage VDD, and the charge pooled in the FD section 26 is discharged.

Subsequently, the column processing section 13 in the solid-state imaging unit 1 performs a comparison process between the reference signal RAMP and the signal (potential-difference signal ΔV) after the analog CDS process until the voltage level of the reference signal RAMP and the voltage level of the signal (potential-difference signal ΔV) after the analog CDS process become the same level. In the example shown in FIG. 7, the voltage level of the reference signal RAMP and the voltage level of the signal (potential-difference signal ΔV) after the analog CDS process become the same level at a time t5. At this timing, output data of the P phase (reset state) corresponding to a state shown in FIG. 8C is obtained.

Figure 8D:
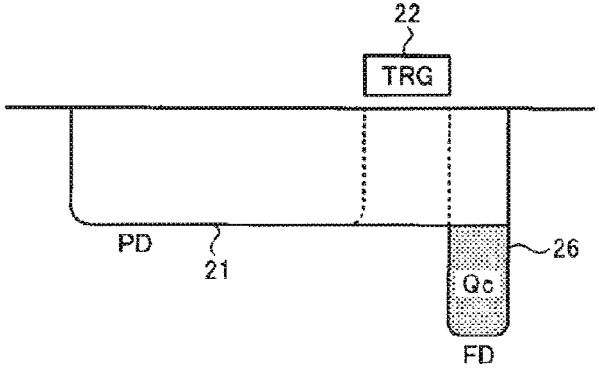
FIG. 8D is a diagram illustrating a state of the operation of transferring charge following FIG. 8C.

Subsequently, as shown in FIG. 7, at a time t6, the testing apparatus 50 controls the sensor control circuit 11 and the vertical scanning circuit 12 in the solid-state imaging unit 1, and supplies a voltage (complete transfer voltage Vc>Vm) at the time of the complete transfer to the pixel 20 to be measured. FIG. 8D illustrates a relationship between potentials (electric potentials) of the region of the PD 21, the gate region of the transfer transistor 22, and the region of the FD section 26 immediately after the operation of applying the complete transfer voltage value Vc. It is to be noted that the complete transfer voltage Vc is set to a value so that the height position of the potential barrier of the gate region is at a bottom position of the potential of the PD 21 or lower when the complete transfer voltage Vc is applied to the gate of the transfer transistor 22. For example, the complete transfer voltage Vc may be set to the power source voltage VDD, etc. of the solid-state imaging unit 1.

By the application of the complete transfer voltage Vc described above, in the example shown in FIG. 8D, the potential barrier of the gate region of the transfer transistor 22 is decreased than that at the time of the intermediate transfer operation (FIG. 8B), and the height position of the potential barrier of the gate region is decreased to the bottom position of the PD 21. Accordingly, as shown in FIG. 8D, all of the charge (intermediate voltage retained charge amount Qc=Qs−n×Qm) accumulated in the PD 21 immediately before the complete transfer operation (after the last intermediate transfer operation) is transferred to the FD section 26.

Subsequently, the column processing section 13 in the solid-state imaging unit 1 performs the comparison process between the reference signal RAMP and the signal (potential-difference signal ΔV) after the analog CDS process until the voltage level of the reference signal RAMP and the voltage level of the signal (potential-difference signal ΔV) after the analog CDS process become the same level. In the example shown in FIG. 7, the voltage level of the reference signal RAMP and the voltage level of the signal (potential-difference signal ΔV) after the analog CDS process become the same level at a time t7. At this timing, output data of the D phase (signal transfer state) corresponding to a state shown in FIG. 8D is obtained. In other words, at the time t7, output data WDMOF corresponding to the charge amount (the intermediate voltage retained charge amount Qc=Qs−n×Qm) accumulated in the PD 21 immediately before the complete transfer operation (after the last intermediate transfer operation) is obtained.

In the present embodiment, the transfer operations in steps S3 and S4 are performed as described above, and the output data WDMOF corresponding to the intermediate voltage retained charge amount Qc of the PD 21 is acquired.

Further, the solid-state imaging unit 1 outputs the output data WDMOF corresponding to the intermediate voltage retained charge amount Qc obtained in step S4 to the intermediate voltage setting section 51 in the testing apparatus 50 via the digital processing circuit 14 (step S5). Thereafter, as shown in FIG. 7, between a time t8 and a time t9, the testing apparatus 50 controls the sensor control circuit 11 and the vertical scanning circuit 12 of the solid-state imaging unit 1, and supplies a high-level signal to each of the gates of the transfer transistor 22 and the reset transistor 24 in the pixel 20 to be measured. Accordingly, both of the PD 21 and the FD section 26 are reset (the charge amounts thereof become zero), and the operations of the intermediate transfer and the complete transfer described above on the predetermined pixel 20 (column) are completed.

Subsequently, the testing apparatus 50 determines whether or not the above-described measurement is performed on all of the pixels 20 (step S6).

In step S6, when the processes in steps S3 to S5 described above are not completed for all of the pixels 20, it is determined to be NO in step S6. In this case, the testing apparatus 50 changes the pixel 20 to be measured (step S7). Subsequently, it returns to the process in step S3, and thereafter, the processes in steps S3 to S7 described above are repeated until measurement for all of the pixels 20 is completed.

On the other hand, in step S6, when the processes in steps S3 to S5 described above are completed for all of the pixels 20, it is determined to be YES in step S6. In this case, the testing apparatus 50 determines whether or not the current intermediate voltage Vm has the maximum value Vm_max of the intermediate voltage Vm which has been set in advance (step S8).

In step S8, when the current intermediate voltage Vm does not have its maximum value Vm_max, it is determined to be NO in step S8. In this case, the testing apparatus 50 controls the sensor control circuit 11, the vertical scanning circuit 12, and the intermediate voltage generation circuit 17 in the solid-state imaging unit 1 to update the intermediate voltage Vm (step S9). For example, the intermediate voltage Vm is increased by a predetermined amount ΔVm (set as Vm=Vm+ΔVm). It is to be noted that the increase amount (ΔVm) of the intermediate voltage Vm may be constant over all of the variable range (from Vm_0 to Vm_max) of the intermediate voltage Vm. Alternatively, the increase amount (ΔVm) for a range around the optimum value Vmd of the intermediate voltage Vm may be smaller than that for other ranges.

After updating the intermediate voltage Vm in step S9, it returns to the process in step S2. Thereafter, the processes in steps S2 to S9 described above are repeated until the intermediate voltage Vm takes its maximum value Vm_max.

On the other hand, in step S8, when the current intermediate voltage Vm has its maximum value Vm_max, it is determined to be YES in step S8. In this case, the intermediate voltage setting section 51 calculates the optimum value Vmd of the intermediate voltage Vm of each of the pixels 20 based on various output data WDMOF corresponding to various intermediate voltages Vm (from Vm_0 to Vm_max) that are obtained by the above-described various processes in each of the pixels 20 (step S10). Specifically, the optimum value Vmd of the intermediate voltage Vm of each of the pixels 20 may be determined as follows.

Figure 9:
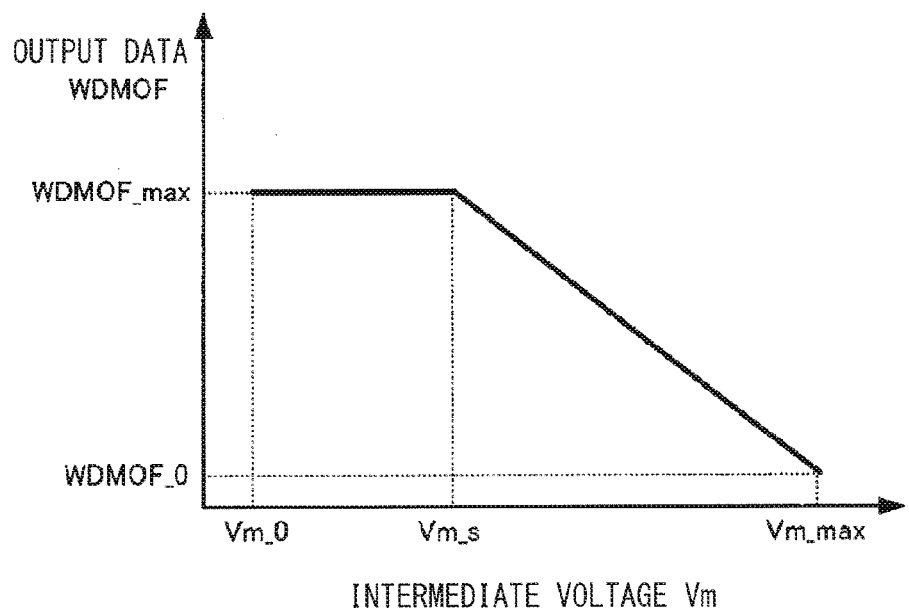
FIG. 9 is a diagram for explaining a method of determining an optimum value of the intermediate voltage of each pixel.

FIG. 9 illustrates a relationship between the various intermediate voltages Vm (from Vm_0 to Vm_max) and the output data WDMOF (the output data corresponding to the intermediate voltage retained charge amount Qc) corresponding to the respective intermediate voltages Vm, that are obtained in the above-described processes in steps S1 to S9, in each of the pixels 20. It is to be noted that, in the characteristics shown in FIG. 9, a lateral axis represents the intermediate voltage Vm and a vertical axis represents the output data WDMOF.

As shown in FIG. 9, when the intermediate voltage Vm has the maximum value Vm_max, the output data WDMOF takes the minimum value WDMOF_0. This is because, when the intermediate voltage Vm is at the maximum, the charge amount Qm transferred from the PD 21 to the FD section 26 in the intermediate transfer operation becomes the maximum, and therefore, the intermediate voltage retained charge amount Qc of the PD 21 immediately before the complete transfer operation becomes the minimum.

Moreover, when the intermediate voltage Vm becomes smaller than the maximum value Vm_max, the output data WDMOF increases linearly. In this variation range, in accordance with decrease in the intermediate voltage Vm, the charge amount Qm transferred from the PD 21 to the FD section 26 in the intermediate transfer operation decreases, and the intermediate voltage retained charge amount Qc of the PD 21 immediately before the complete transfer operation increases.

Further, the value of the output data WDMOF is constant (the maximum value WDMOF_max) in a range of not larger than the intermediate voltage Vm around the intermediate voltage (Vm_s) at which the charge amount (Qc) transferred at the time of the complete transfer operation equals to the saturated charge amount Qfd of the FD section 26. In this output constant range, at the time of the complete transfer operation, the charge amount (Qc) to be transferred to the FD section 26 becomes equal to or larger than its saturated charge amount Qfd. Therefore, the output data WDMOF is saturated, and becomes constant at the maximum value WDMOF_max.

As described above, around the intermediate voltage Vm_s in FIG. 9 at which the output data WDMOF is saturated, the intermediate voltage retained charge amount Qc of the PD 21 immediately before the complete transfer operation becomes substantially the same as the saturated charge amount Qfd of the FD section 26. In other words, a state around the intermediate voltage Vm_s is a state corresponding to the lower limit (Qc=Qm) in the above-described Expression (1), and a range of the intermediate voltage from Vm_s to Vm_max of the characteristics shown in FIG. 9 is a preferable range of the intermediate voltage Vm that satisfies the condition in the above-described Expression (1).

Therefore, in step S10, the intermediate voltage setting section 51 sets a predetermined intermediate voltage Vm, out of the range of the intermediate voltage from Vm_s to Vm_max, as the optimum value Vmd of the intermediate voltage Vm of the pixel 20, based on the relationship between the intermediate voltage Vm and the output data WDMOF shown in FIG. 9. In the present embodiment, the intermediate voltage Vm_s at which the intermediate voltage retained charge amount Qc of the PD 21 becomes substantially the same as the saturated charge amount Qfd of the FD section 26 is set as the optimum value Vmd of the intermediate voltage Vm of the pixel 20.

Here, referring to FIG. 6 again, description will be given of processes after step S10. After step S10, the intermediate voltage setting section 51 determines the optimum intermediate voltage Vmo that satisfies the condition in the above-described Expression (1) in all of the pixels 20 based on the optimum value Vmd of the intermediate voltage Vm of each of the pixels 20 obtained in step S10 (step S11).

In the present embodiment, out of the optimum values Vmd of the intermediate voltage Vm obtained for the respective pixels 20, its maximum value is selected, and the selected maximum value is set as an intermediate voltage setting value Vmo. The intermediate voltage setting value Vmo selected in such a manner is a value in the range of the intermediate voltage from Vm_s to Vm_max in the characteristics shown in FIG. 9 in all of the pixels 20, and therefore, the condition in the above-described Expression (1) is satisfied. In this case, in the complete transfer operation at the time of the usual reading operation, the charge does not overflow from the FD section 26. Therefore, it is possible to accurately read the data (pixel signal) corresponding to the charge amount accumulated in the PD 21.

Subsequently, the intermediate voltage setting section 51 controls the writing control section 19, and records information of the determined optimum intermediate voltage Vmo in the storage section 16 in the solid-state imaging unit 1 (step S12). In the present embodiment, the optimum intermediate voltage Vmo at the time of reading is written in the storage section 16 in the solid-state imaging unit 1 in such a manner before shipment.

As described above, in the solid-state imaging unit 1 of the present embodiment, the value of the optimum intermediate voltage Vmo stored in the storage section 16 thereof is a value that satisfies the condition in the above-described Expression (1) in all of the pixels 20. Therefore, in the present embodiment, in the solid-state imaging unit 1 of the division reading scheme, it is possible to reduce the influence of the variations in performance of the transfer transistor 22 described above, and to accurately reproduce the image data.

Moreover, the reading scheme of the solid-state imaging unit 1 of the present embodiment is the division reading scheme, and is a reading scheme that is capable of expanding a dynamic range (a range from low illuminance to high illuminance). Therefore, in the present embodiment, it is possible to accurately read the data (pixel signal) corresponding to the charge amount in a broader range.

Moreover, the solid-state imaging unit 1 of the present embodiment has the following advantage compared, for example, to Patent Literature 2. In Patent Literature 2, the intermediate voltage is controlled by feedback control with the use of a pixel dedicated for controlling the intermediate voltage to have the optimum value. However, in this method, the intermediate voltage is not allowed to be controlled to have the optimum value until the lifetime of the product ends when the dedicated pixel is broken before the usual reading pixels. On the other hand, in the present embodiment, the optimum intermediate voltage Vmo stored in the storage section 16 in advance is used. Therefore, it is possible to control the intermediate voltage Vm to have the optimum value until the usual reading pixels are broken, in other words, until the lifetime of the product ends.

It is to be noted that the method of setting the optimum intermediate voltage Vmo according to the present disclosure is not limited to the above-described method. Any method may be used as long as the method is a method of determining the relationship between the intermediate voltage Vm and the information (output data WDMOF) related to the intermediate voltage retained charge amount Qc of the PD 21 immediately before the complete transfer operation, and of determining the optimum intermediate voltage Vmo based on the relationship.

For example, in the method of setting the optimum intermediate voltage Vmo in the above-described embodiment, description has been given of an example in which the analog CDS process, the AD conversion process (comparison process), and the digital CDS process are performed in the intermediate transfer operation (step S3). However, the present disclosure is not limited thereto. As described above, the output data is not read in the intermediate transfer operation in the method of setting the optimum intermediate voltage Vmo in the above-described embodiment. Therefore, in the intermediate transfer operation in step S3, it may move to the complete transfer operation (step S4) after transferring part of the charge of the PD 21 to the FD section 26 without performing the analog CDS process, the AD conversion process (comparison process), and the digital CDS process.

Moreover, in the method of setting the optimum intermediate voltage Vmo in the above-described embodiment, description has be given of an example in which the initial value of the intermediate voltage Vm is set as the minimum value (Vm_0) of its variable range (step S1), and the intermediate voltage Vm is increased when the intermediate voltage Vm is updated (step S9). However, the present disclosure is not limited thereto. The initial value of the intermediate voltage Vm may be set as the maximum value (Vm_max) of its variable range, and the intermediate voltage Vm may be decreased when the intermediate voltage Vm is updated.

Moreover, in the above-described embodiment, description has been given of an example in which the intermediate voltage Vm_s corresponding to the lower limit (Qc=Qm) in the above-described Expression (1) is set as the optimum value Vmd of the intermediate voltage Vm of each of the pixels 20. However, the present disclosure is not limited thereto. For example, the optimum voltage Vmd of the intermediate voltage Vm in each of the pixels 20 may set to have a margin in advance in consideration of variation in performance of the transfer transistor 22 resulting from a change in environment of using the solid-state imaging unit 1, etc. For example, the optimum value Vmd of the intermediate voltage Vm in each of the pixels 20 may set to be a value higher than Vm_s by an amount corresponding to the variation in performance of the transfer transistor 22 which is conceivable based on the change in environment, etc. Moreover, the optimum intermediate voltage Vmo of the solid-state imaging unit 1 to be determined finally may be set to have a margin in advance in consideration of the variation in performance of the transfer transistor 22 resulting from the change in environment of using the solid-state imaging unit 1, etc.

Moreover, in the above-described embodiment, description has been given of an example in which the output data WDMOF obtained at the time of the complete transfer operation is used as the information related to the intermediate voltage retained charge amount Qc of the PD 21. However, the present disclosure is not limited thereto. For example, the intermediate voltage retained charge amount Qc of the PD 21 may be calculated from the output data WDMOF obtained at the time of the complete transfer operation, and the optimum intermediate voltage Vmo may be determined based on the intermediate voltage retained charge amount Qc.

Moreover, in the solid-state imaging unit 1 of the above-described embodiment, description has been given of an example in which the dual noise cancelling scheme is used as the signal processing scheme. However, the present disclosure is not limited thereto. The above-described technology of the present disclosure may be applied to a solid-state imaging unit of a signal processing scheme that carries out one of the analog CDS process and the digital CDS process. Moreover, the present disclosure may have a configuration in which the AD conversion circuit 34 calculates a difference between the noise signal and the pixel signal to perform the noise removing process without including the analog CDS circuit 31 and the digital CDS circuit 35 in the column processing section 13. Moreover, in the above-described embodiment, description has been given of an example in which the digital addition/non-addition circuit 37 performs the addition/non-addition process on the output data (DataA) at the time of the intermediate transfer operation and the output data (DataB) at the time of the complete transfer operation. However, the present disclosure is not limited thereto. For example, there may be adopted a configuration in which the addition/non-addition process on the output data is performed in the AD conversion circuit 34. Alternatively, for example, there may be adopted a configuration in which the addition/non-addition process on the output data is performed in a signal processing circuit (not illustrated) that includes a DSP (Digital Signal Processor) provided in a latter stage of the column processing section 13.

Moreover, the above-described technology of the present disclosure is applicable to both of a solid-state imaging unit of a front illumination type in which light is irradiated from a front surface on the wiring layer side of the substrate and a solid-state imaging unit of a back irradiation type in which light is irradiated from a surface (back surface) on the opposite side from the wiring layer side of the substrate.

Moreover, the above-described technology of the present disclosure is applicable not only to the solid-state imaging unit in which the incident light is visible light but also applicable to a solid-state imaging unit in which the incident light is of infrared rays, X rays, etc. Moreover, the above-described technology of the present disclosure is also applicable to a solid-state imaging unit that outputs distribution of an amount of incident particles, etc, as an image.

Moreover, the above-described technology of the present disclosure is applicable not only to the solid-state imaging unit of a scheme of sequentially scanning the pixels in the pixel section in a row unit and reading the pixel signals from the respective pixels, but is also applicable to a solid-state imaging unit of an X-Y address scheme of selecting an arbitrary pixel in the pixel section and reading the pixel signal from the selected pixel. Moreover, the solid-state imaging unit described in the above embodiment itself may be configured of one chip. Alternatively, the solid-state imaging unit described in the above embodiment may be packaged integrally with the signal processing circuit, the optical system, etc. to configure an imaging module.

3. Configuration of Electronic Apparatus

Application Example

The solid-state imaging unit according to the present disclosure is applicable to various electronic apparatuses. For example, the solid-state imaging unit described in the above embodiment is applicable to electronic apparatus, for example, a camera system such as a digital still camera and a digital video camcorder, a mobile phone having an imaging function, other apparatus having an imaging function, etc. Here, description will be given referring to the digital video camcorder as an example for a configuration example of the electronic apparatus.

Figure 10:
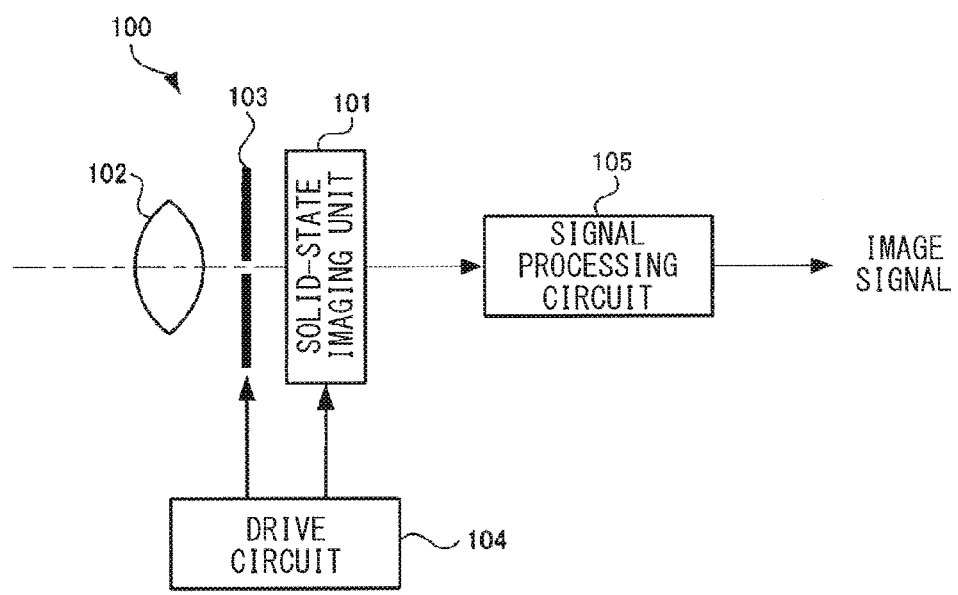
FIG. 10 is a diagram illustrating an example of an electronic apparatus to which the solid-state imaging unit of the present disclosure is applied.

FIG. 10 illustrates a schematic configuration of a digital video camcorder (hereinafter, simply referred to as "camera") to which the solid-state imaging unit described in the above embodiment is applied.

A camera 100 includes a solid-state imaging unit 101, an optical system 102, a shutter unit 103, and a drive circuit 104. The optical system 102 leads incident light to a light receiving section (not illustrated) in the solid-state imaging unit 101. The shutter unit 103 is provided between the solid-state imaging unit 101 and the optical system 102. The drive circuit 104 drives the solid-state imaging unit 101. Moreover, the camera 100 includes a signal processing circuit 105 that processes an output signal from the solid-state imaging unit 101.

The solid-state imaging unit 101 is a solid-state imaging unit of the division reading scheme, and may be configured, for example, of the solid-state imaging unit 1 described in the above embodiment. Configurations and functions of other sections are as follows.

The optical system (optical lens) 102 forms an image, of image light (incident light) from a subject, on an imaging plane (not illustrated) of the solid-state imaging unit 101. Accordingly, signal charge is accumulated in the solid-state imaging unit 101 for a certain period. It is to be noted that the optical system 102 may be configured of an optical lens group including a plurality of optical lenses. Moreover, the shutter unit 103 controls a period (light irradiation period) in which light is incident on the solid-state imaging unit 101, and a period (light blocking period) in which the light incident on the solid-state imaging unit 101 is blocked.

The drive circuit 104 supplies drive signals to the solid-state imaging unit 101 and the shutter unit 103. Further, the drive circuit 104 controls, with the use of the supplied drive signals, an operation of the solid-state imaging unit 101 to transfer a signal to the signal processing circuit 105, and a shutter operation of the shutter unit 103. Specifically, in this example, the operation of transferring the signal from the solid-state imaging unit 101 to the signal processing circuit 105 is performed based on the drive signal (timing signal) supplied from the drive circuit 104.

The signal processing circuit 105 performs various signal processes on the signal transferred from the solid-state imaging unit 101. Further, the signal (image signal) subjected to the various signal processes may be stored in a storing medium (not illustrated) such as a memory, or may be outputted to a monitor (not illustrated).

In the camera 100 of the present embodiment, the solid-state imaging unit of the division reading scheme according to the present disclosure is used as the solid-state imaging unit 101. Therefore, it is possible to reduce influence, on reading performance, of the variations in performance of the transfer transistors 22 described above, and therefore, it is possible to achieve imaging with high image quality.

It is to be noted that it is also possible to achieve the following configurations from the present disclosure.

(1) A solid-state imaging unit including:
a pixel section including a plurality of pixels each including a photoelectric conversion section, a charge-voltage conversion section, and a transfer transistor transferring charge accumulated in the photoelectric conversion section to the charge-voltage conversion section; and
a storage section storing information about an optimum value of an intermediate voltage to be applied to a gate of the transfer transistor at time of an intermediate transfer operation when a signal charge accumulated in the photoelectric conversion section is divided to be read in a predetermined times of the intermediate transfer operations and a complete transfer operation.

(2) The solid-state imaging unit according to (1), wherein the optimum value of the intermediate voltage is a maximum value in optimum values of the intermediate voltage in the respective pixels.

(3) The solid-state imaging unit according to (1) or (2), wherein information about an optimum value of the intermediate value of each of the pixels is stored in the storage section.

(4) The solid-state imaging unit according to any one of (1) to (3), wherein the storage section includes an electrically-programmable fuse.

(5) The solid-state imaging unit according to any one of (1) to (4), wherein optimum values of the intermediate voltage of all of the pixels are set to values that satisfy the following relational expression, $$Qs - n \times Qm = Qc \leq Qfd,$$

where Qc is a charge amount transferred from the photoelectric conversion section to the charge-voltage conversion section at time of the complete transfer operation, Qm is a charge amount transferred from the photoelectric conversion section to the charge-voltage conversion section in each of the intermediate transfer operations, Qs is a saturated charge amount of the photoelectric conversion section, Qfd is a maximum charge amount that is allowed to be accumulated in the charge-voltage conversion section, and n is number of times of the intermediate transfer operations.

(6) The solid-state imaging unit according to any one of (1) to (5), wherein a scheme of a signal process performed at a time of reading the signal charge is a dual noise cancelling scheme.

(7) An electronic apparatus including:

a solid-state imaging unit including a pixel section including a plurality of pixels each including a photoelectric conversion section, a charge-voltage conversion section, and a transfer transistor transferring charge accumulated in the photoelectric conversion section to the charge-voltage conversion section, and a storage section storing information about an optimum value of an intermediate voltage to be applied to a gate of the transfer transistor at time of an intermediate transfer operation when the signal charge accumulated in the photoelectric conversion section is divided to be read in a predetermined times of the intermediate transfer operations and a complete transfer operation; and a signal processing circuit performing a predetermined process on an output signal from the solid-state imaging unit.

This application claims priority of Japanese Patent Application JP 2012-061703 filed Mar. 19, 2012, the entire contents of each which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging unit comprising:
a pixel section including a plurality of pixels each including a photoelectric conversion section, a charge-voltage conversion section, and a transfer transistor transferring charge accumulated in the photoelectric conversion section to the charge-voltage conversion section; and
a storage section storing information about an optimum value of an intermediate voltage to be applied to a gate of the transfer transistor at time of an intermediate transfer operation when a signal charge accumulated in the photoelectric conversion section is divided to be read in predetermined times of intermediate transfer operations and a complete transfer operation.

2. The solid-state imaging unit according to claim 1, wherein the optimum value of the intermediate voltage is a maximum value in optimum values of the intermediate voltage in the respective pixels.

3. The solid-state imaging unit according to claim 1, wherein information about an optimum value of the intermediate value of each of the pixels is stored in the storage section.

4. The solid-state imaging unit according to claim 1, wherein the storage section includes an electrically-programmable fuse.

5. The solid-state imaging unit according to claim 1, wherein optimum values of the intermediate voltage of all of the pixels are set to values that satisfy the following relational expression, $$Qs - n \times Qm = Qc \leq Qfd,$$

where Qc is a charge amount transferred from the photoelectric conversion section to the charge-voltage conversion section at time of the complete transfer operation, Qm is a charge amount transferred from the photoelectric conversion section to the charge-voltage conversion section in each of the intermediate transfer operations, Qs is a saturated charge amount of the photoelectric conversion section, Qfd is a maximum charge amount that is allowed to be accumulated in the charge-voltage conversion section, and n is number of times of the intermediate transfer operations.

6. The solid-state imaging unit according to claim 1, wherein a scheme of a signal process performed at a time of reading the signal charge is a dual noise cancelling scheme.

7. An electronic apparatus comprising:
a solid-state imaging unit including
a pixel section including a plurality of pixels each including a photoelectric conversion section, a charge-voltage conversion section, and a transfer transistor transferring charge accumulated in the photoelectric conversion section to the charge-voltage conversion section, and
a storage section storing information about an optimum value of an intermediate voltage to be applied to a gate of the transfer transistor at time of an intermediate transfer operation when a signal charge accumulated in the photoelectric conversion section is divided to be read in predetermined times of intermediate transfer operations and a complete transfer operation; and
a signal processing circuit performing a predetermined process on an output signal from the solid-state imaging unit.

* * * * *